(12) United States Patent
Sinclair et al.

(10) Patent No.: US 8,914,762 B1
(45) Date of Patent: Dec. 16, 2014

(54) AUTOMATED GENERATION OF PLATFORM-SPECIFIC LOGIC DESIGNS FOR TARGET ENVIRONMENTS FROM A COMMON BASE DESIGN

(71) Applicant: Xilinx, Inc., San Jose, CA (US)

(72) Inventors: Martin Sinclair, Eskbank (GB); Brian Cotter, Tranent (GB)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/951,135

(22) Filed: Jul. 25, 2013

(51) Int. Cl.
*G06F 17/50* (2006.01)

(52) U.S. Cl.
CPC ..................... *G06F 17/50* (2013.01)
USPC ........... 716/126; 716/103; 716/104; 716/110; 716/111; 716/112; 716/121; 716/128

(58) Field of Classification Search
CPC .............. G06F 17/5045; G06F 17/505; G06F 17/5022; G06F 17/50; G06F 17/5081; G06F 2217/84; G06F 17/5077; G06F 2217/74; G06F 13/00; G06F 17/5027; G06F 17/5072; G06F 2217/40

USPC .................................. 716/100–104, 110–112
See application file for complete search history.

(56) References Cited

U.S. PATENT DOCUMENTS 5,625,567 A * 4/1997 Mankin et al. ................. 716/103
7,149,995 B2 * 12/2006 Raghunandran .............. 716/112
7,219,311 B2 * 5/2007 Koga et al. ..................... 716/103

\* cited by examiner

*Primary Examiner* — Nghia Doan
(74) *Attorney, Agent, or Firm* — Kin-Wah Tong

(57) ABSTRACT

A method, computer-readable medium and apparatus for creating a platform-specific logic design from an input design are disclosed. For example, a method includes receiving an input design and an identification of a target device. The method next determines an unconnected external interface of the input design and detects an unconnected external interface of the target device. The method then generates an updated design from the input design. The updated design includes the input design and further includes a connection between the unconnected external interface of the input design and the unconnected external interface of the target device.

17 Claims, 9 Drawing Sheets

US 8,914,762 B1

AUTOMATED GENERATION OF PLATFORM-SPECIFIC LOGIC DESIGNS FOR TARGET ENVIRONMENTS FROM A COMMON BASE DESIGN

FIELD OF THE INVENTION

The present disclosure relates generally to the porting of logic designs to logic devices.

BACKGROUND OF THE INVENTION

A common part of the design and creation of digital logic devices is porting an existing logic design to a new platform. Circuit boards are often revised during the course of their life as obsolete or expensive parts are replaced with newer or less expensive parts. Different circuit boards may be required in order to meet national market requirements, or different form constraints. Therefore, different variants on an external interface may be required, while the underlying logic design remains the same.

SUMMARY OF THE INVENTION

The present disclosure provides a method for creating a platform-specific logic design from an input design. For example, the method can receive an input design and an identification of a target device. The method determines an unconnected external interface of the input design and detects an unconnected external interface of the target device. The method then generates an updated design from the input design. The updated design includes the input design and further includes a connection between the unconnected external interface of the input design and the unconnected external interface of the target device.

In various embodiments: the method further comprises matching the external interface of the input design to the external interface of the target design when the external interface of the input design and the external interface of the target device are of a same interface type; the same interface type comprises a media access control interface; the input design comprises a media access control component and the target device comprises a physical ethernet component; the determining comprises generating a netlist from the input design and identifying external interfaces of the input design within the netlist; the external interfaces of the input design comprise hardware description language ports; the unconnected external interface of the input design and the unconnected external interface of the target device are of a same interface type; the generating comprises selecting an interface version of the interface type for connecting the unconnected external interface of the input design to the unconnected external interface of a component of the target device; the interface version of the interface type comprises a media access control interface; the interface version comprises, a media independent interface, a gigabit media independent interface, a reduced gigabit media independent interface or a serial gigabit media independent interface; the unconnected external interface of the input design comprises a split interface; the connection comprises a connection between the split interface and the unconnected external interface of the target device; the unconnected external interface of the target device is detected using a constraint file for the target device; the input design comprises a description of digital logic to be implemented on a device; the input design comprises constraint associated with a portion of the digital logic, wherein the constraint comprises a restriction on a location for implementing the digital logic within the target device or a restriction on a signal timing for a signal of the digital logic when the digital logic is implemented within the target device; the input design includes a component having a metadata description; the component comprises one of a static component, a parameterizable component or a configurable component; the unconnected external interface of the target device comprises an unconnected external interface of a logic device of the target device.

The present disclosure also provides a non-transitory computer-readable medium that stores instructions for creating a platform-specific logic design from an input design. When executed by a processor, the instructions cause the processor to perform the operations which can include: receiving an input design and an identification of a target device, determining an unconnected external interface of the input design, detecting an unconnected external interface of the target device, and generating an updated design from the input design. The updated design includes the input design and further includes a connection between the unconnected external interface of the input design and the unconnected external interface of the target device.

The present disclosure further provides a device for creating a platform-specific logic design from an input design. The device can include a processor and a computer-readable medium storing instructions which, when executed by the processor, cause the processor to perform operations which include: receiving an input design and an identification of a target device, determining an unconnected external interface of the input design, detecting an unconnected external interface of the target device, and generating an updated design from the input design. The updated design includes the input design and further includes a connection between the unconnected external interface of the input design and the unconnected external interface of the target device.

BRIEF DESCRIPTION OF THE DRAWINGS

Accompanying drawings show exemplary circuits and methods in accordance with one or more aspects of the disclosure; however, the accompanying drawings should not be taken to limit the disclosure to the examples shown, but are for explanation and understanding only.

To facilitate understanding, identical reference numerals have been used, where possible, to designate identical elements that are common to the figures.

DETAILED DESCRIPTION OF THE DRAWINGS

Figure 1:
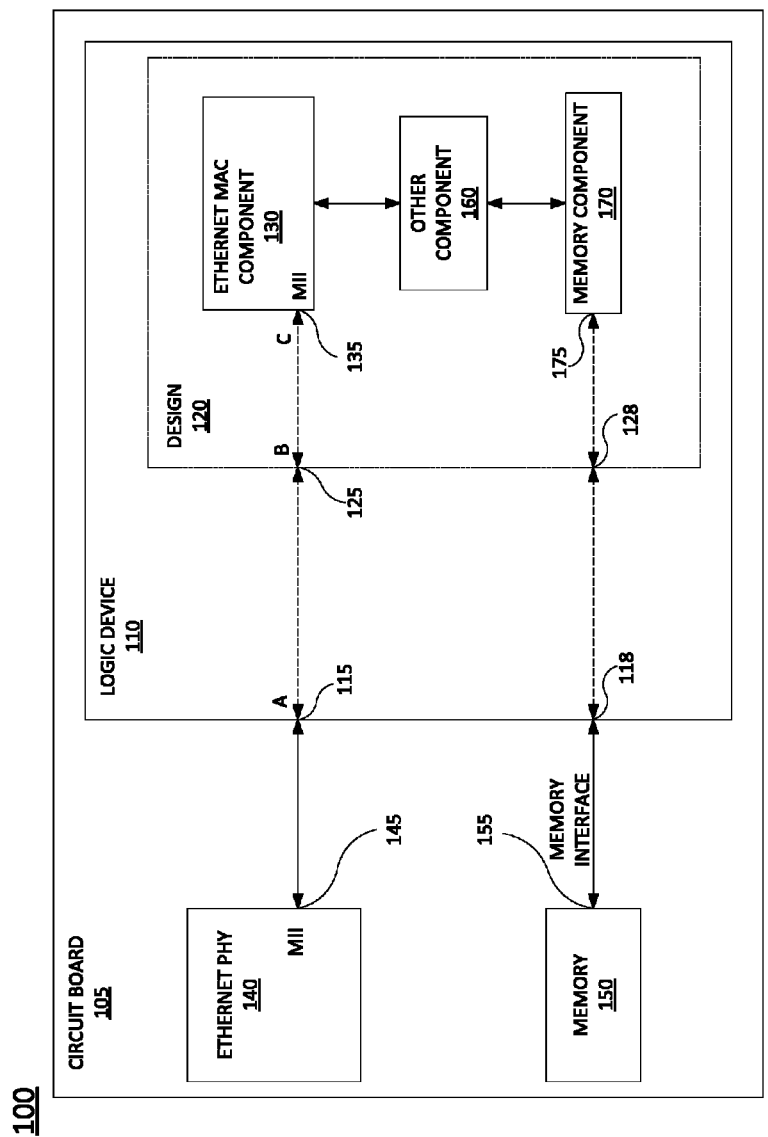
FIG. 1 illustrates a block diagram of a first device.

While the following describes various examples in accordance with one or more aspects of the present disclosure, other and further embodiment(s) in accordance with the one or more aspects of the present disclosure may be devised without departing from the scope thereof. Thus, the present disclosure is not limited by the examples that follow, and such examples are provided only by way of illustration.

The porting of logic designs to new or different devices/platforms is often a time consuming and expensive process. For example, a user/designer that wishes to implement a logic design within a particular target logic device consults with constraint files and circuit diagrams, which list the connections on the logic device and their relationship to other devices on the circuit board. The designer then manually associates each external interface of the logic design with a corresponding physical external interface of the target device (e.g., within the HDL description at the register transfer level (RTL), or by a constraint file that associates the external interface with a physical location on the logic device). This process needs to be manually repeated for each new target device on which the logic design is implemented. When porting a logic design to a new or different platform, different variants on an external interface may be required, while the underlying design remains the same. A common solution is to "wrap" the design with a platform-specific layer, and to have one such layer for each target platform. This increases complexity, as the outer layers often require a mechanism by which they can configure the core design to their needs. Because a common static design is used, this does not allow for the inclusion of configurable components (e.g., intellectual property (IP) cores) within the static part of the design. Instead, any platform-specific IP cores must be kept in the platform-specific layer rather than the common generic design.

To address these and other issues, in one example the present disclosure comprises a software tool that infers and generates an external connection scheme for the logic design depending upon the target environment, i.e., the specific type of integrated circuit or logic device on which the design is to be implemented. In this way, the present disclosure enables a designer to create a platform-neutral design without explicit connections between external interfaces. In particular, it is left to the software tool to automatically infer and to create/add the necessary connections and any intermediate interfaces. In one example, the software tool searches for an unconnected external interface within the logic design and searches for unconnected external interface of the target logic device that is of a matching interface type. When such a match is found, the software tool creates a connection between these unconnected external interfaces, and adds the connection to the logic design, thereby generating a platform-specific logic design. If the platform-neutral, or base logic design is to be implemented on a different target device, the same process is repeated to create a different platform-specific logic design.

The following terms are used within this disclosure:

Logic Device—an integrated circuit capable of supporting a design; it may be programmable;

Hardware platform—an item of hardware including a logic device and associated circuitry;

Design—a description of all digital logic to be implemented on a logic device;

Component, or Core—a piece of digital logic which implements a part of a design; and which has an associated metadata description;

Static Component—a component whose external connections and behavior cannot be varied;

Parameterizable Component—a component whose external connections can be varied slightly by parameterization when synthesizing that component;

Configurable Component—a component whose external connections can be varied, added, and removed by parameterization when synthesizing that component;

Port, or Pin—a hardware description language (HDL) port on a component or logic device;

Signal, or Net—a group of one or more ports with a common connection;

Interface—a defined group of signals. Where the interface exists on a component, it may be referred to as a "component interface"; when it exists on a logic device and is connected externally to another device on the hardware platform, it may be referred to as a "board interface". An interface may be composed of both ports and other interfaces. An external interface is an interface from one layer to another layer or from one device or component to another device or component. An unconnected interface is an interface having none of its ports connected to a logic block, or design component at both ends, i.e. the net has one or fewer "concrete" ports on a logic device or logic block (however, it may be connected to abstract ports at an intermediate layer of the design hierarchy);

Constraint—instructions given to the implementation tools to direct the mapping, placement, timing, or other guidelines while processing a design (e.g. mapping a design port to a physical pin on the logic device).

Figure 9:
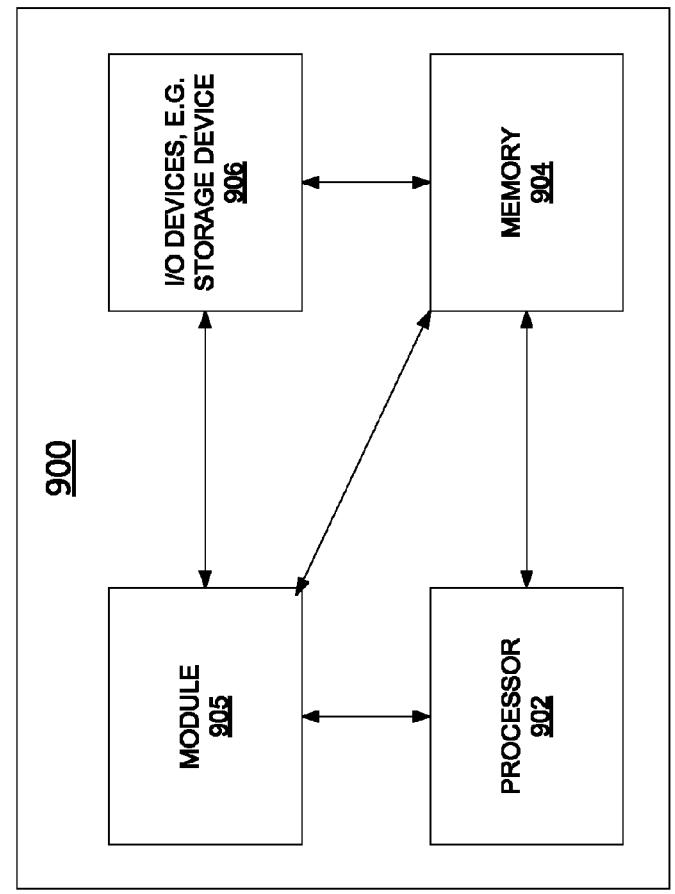
FIG. 9 illustrates a high level block diagram of a general purpose computer, or a computing device suitable for use in performing the functions described herein.

The present disclosure relates generally to methods, computer-readable media and devices for creating platform-specific logic designs from a base, or common logic design. In one example, the present disclosure comprises an automated software tool, or method that is implemented within a computing device, such as shown in FIG. 9, to receive an input, or base logic design and to output a platform-specific logic design. For instance, the software tool may comprises a series of instructions which may be stored on a computer-readable medium and which cause a processor to perform steps, functions and/or operations for creating a platform-specific logic design in accordance with the present disclosure.

In one example, the software tool infers and generates an external connection scheme for the design depending upon the target environment, i.e., the particular type of integrated circuit or logic device on which the design is to be implemented. In one example, the linkage of unconnected external interfaces within the input design to appropriate interfaces at the boundary of the logic device is automated. For example, components within the input design are further configured to select an appropriate unconnected external interface, which is then connected to one of the unconnected external interfaces within the design. One instance also applies appropriate constraints such as restricting all or a portion of the design to a particular physical location, or locations on the target device. For example, clock and reset signals may be physically constrained due to timing issues. In addition, one example also includes the detection and reuse of partial connections across layers of a design hierarchy.

Similarly, the available signals and interfaces on a component of the design (whether configurable, parameterizable, or static) and the component signals are known. This information is held within description files for that component or Intellectual Property (IP) core, rather than as an intrinsic part of the HDL specification, e.g. it is not part of the Verilog or VHDL (very-high speed integrated circuit (VHSIC) HDL) language standards. Within the design tool, a "netlister" is able to generate a record of connections that is accessible to the user for querying the connectivity between interfaces at each layer of the design hierarchy, from the logic device down to the configurable component, including any intermediate layers within that hierarchy. This netlister is able to assess not just the interface connectivity, but also the connectivity of each interface or port within the interface.

Generally, a digital logic device includes a circuit board and a logic device, e.g., an integrated circuit (IC). For example, the logic device may comprise a programmable logic device (PLD), a dedicated IC, a field programmable gate array (FPGA), an application specific IC (ASIC) and the like. The logic device may be mounted on or otherwise connected to the circuit board.

Conventionally, a component within a design must be manually connected to a logic device's external interface. Existing practice allows for interfaces to be defined on the logic device by means of constraint files and circuit diagrams, which list the connections on the logic device and their relationship to other devices on the circuit board. For example, within the constraint files/description files is a description of: the board upon which the logic device is mounted, the interfaces between the logic device and the board, the interfaces' component signals, the pin locations for the component signals, and the sensitivity of the component signals. For instance, a constraint file for the logic device may include a definition of an interface (e.g., a media independent interface (MII)). A typical logic design may include one or more components, such as an Ethernet media address control (MAC) component. For example, a component may comprise an IP core. In order for a design to function within the logic device on the circuit, the designer must redefine the design components' interface connection(s) at the design top level, connect the component interface(s) to the top level of the design, and map the design top level onto the logic device by constraining the component signals at the design level to the appropriate pins on the logic device. For example, the designer may explicitly define an interface within the top level of the design and an interface within the Ethernet MAC component for connecting the Ethernet MAC component to the interface of the logic device. In particular, the designer may define the interfaces to be MII interfaces to match the external interface of the logic device, e.g., within the HDL description at the register transfer level (RTL), or by a constraint file. For example, as noted above the external interface of the logic device may be defined to be a MII interface, e.g., as defined by a constraint file for the logic device.

It should be noted that MII is a standard defined interface for connecting a MAC logic block to an Ethernet PHY. Various examples are provided herein that describe MII interfaces. However, the present disclosure is equally applicable to designs and logic devices that use different versions or variants of the MII interface type for media access control, such as: Reduced Gigabit Media Independent Interface (RGMII), Serial Gigabit Media Independent Interface (SGMII), Reduced Media Independent Interface (RMII), Gigabit Media Independent Interface (GMII), and the like. In addition, the present disclosure is not limited to MAC blocks for controlling Ethernet chips, but is applicable to various different types of interfaces for numerous other functions, e.g., for interactions between one or more design components and a memory, a radio transceiver, an input/output device, and so forth.

In contrast to the foregoing, the present disclosure allows a designer to create a platform-neutral design without explicit connections between external interfaces. In particular, it is left to a software tool to automatically infer and to create/add the necessary connections and any intermediate interfaces. As an example, FIG. 1 illustrates a block diagram of a first exemplary device 100. Device 100 includes a logic device 110, which may be mounted on or otherwise connected to a circuit board 105. In the example of FIG. 1, a design 120 is for implementation within logic device 110. As illustrated, the design 120 includes a plurality of components 130, 160 and 170, also referred to herein as logic blocks or IP cores. For example, component 130 may comprise an Ethernet MAC component, component 170 may comprise a memory component and component 160 may comprise yet another component type. As illustrated in FIG. 1, the design 120 is a flat design, featuring only a single layer of design hierarchy.

In one example, the present disclosure comprises an automated tool, e.g., a software tool or method that makes connections between unconnected interfaces within the design 120 and unconnected interfaces at the board level. The dashed arrowed lines in FIG. 1 indicate the connections made by such a software tool. In one example, logic device 110 has a predefined interface 115 for connection to an interface 145 of a physical Ethernet (Ethernet PHY) chip 140. In one example, each of the interfaces 115 and 145 comprises a media independent interface (MII). Logic device 110 also has a predefined interface 118 (e.g., a memory interface) for connection to interface 155 of memory 150. Each of these interfaces may be predefined in one or more constraint or configuration files for the device 100.

In the example of FIG. 1, design 120 may comprise a platform-neutral design that has any number of components for performing various functions. Notably, no explicit external connections are defined for the components within the design. In one instance, the software tool of the present disclosure determines each unconnected interface on the logic device 110 and notes the interface type. In addition, the design 120 is searched for components with unconnected external interfaces that match that interface type exactly. As noted above, an MII interface 115 is defined on the logic device 110. In this example, the software tool determines that an unconnected MII interface 135 is present on the Ethernet MAC component 130 within the design 120. The software tool also determines that interface 115 exists on the logic device, that it is an MII interface and that it is not connected by the input design 120. Thus, since the two unconnected interfaces match exactly, the software tool automatically defines an interface 125 at the top level of the design 120, and makes a connection between the logic device interface 115 (at A) and the newly defined interface 125 of the design 120 (at B). A connection is also made between the newly defined interface 125 of the design and the component interface 135 (at C). This is repeated for the memory interface 118 and interface 175 of memory component 170 to create a new "intermediate" interface 128 within the top-level of the design 110. In one example, each of the logic blocks is defined using industry standard type definitions to declare the type(s) and name(s) of the interface(s). For example, IP-XACT (IEEE 1685-2009) is an industry standard for describing an IP block, where each interface has a unique type identifier (ID).

The example of FIG. 1 assumes that a single layer of design contains all of the components, logic blocks and/or IP cores. However, a more practical situation is a hierarchical design, where multiple layers of design exist between the top level of the design, and the logic blocks with external interfaces.

Figure 2:
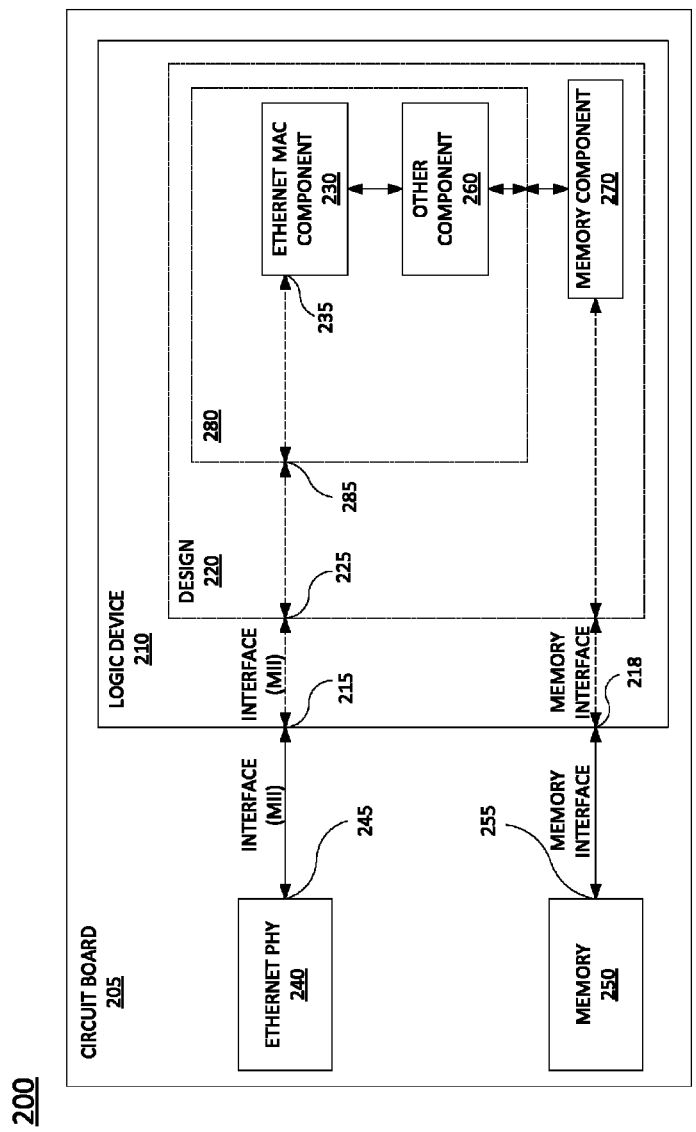
FIG. 2 illustrates a block diagram of a second device.

FIG. 2 illustrates a block diagram of a second device 200, e.g., for implementing a hierarchical design. The device 200 includes a design 220 that can be implemented within logic device 210. Logic device 210 is mounted on or otherwise connected to circuit board 205 that also includes Ethernet PHY 240. Interfaces 215 and 245 are connected according to the pre-configuration of the device 200. In one example, the external interface 215 is defined in a constraint and/or configuration file for the logic device 210 and/or for the device 200. In one example, each of these interfaces comprises a Media Independent Interface (MII).

Design 220 is an example of a hierarchical design, where components exist at various layers and where each of the components may include various subcomponents. For instance, design 220 includes component 280 and component 270 (a memory component). Component 280 is in turn comprised of sub-components 230 (an Ethernet MAC component) and 260. In one instance, the present disclosure makes one or more connections between the design top level and a logic block at a lower level of the hierarchy. For example, the present disclosure traverses the design 220 upwards from each logic block, adding the relevant connections at each layer of the design as it is crossed. Each interface connection at each layer is the same as the connection on the logic block's external interface.

For example, the software tool starts with sub-component 230 and determines at least one unconnected external interface 235 exists. The software tool searches for unconnected external interfaces in the next highest layer, and so forth. The software tool also detects that logic device 210 includes an unconnected external interface 215. The software tool further determines that the unconnected interfaces 215 and 235 are of the same type (e.g., MII), infers the connection should be established, and automatically creates the connection between interfaces 215 and 235. In particular, the software tool again traverses the design, starting from the lowest level at which the unconnected external interface was determined (i.e., at interface 235 of component 230). Since a complementary interface does not yet exist within the next layer above, i.e., within component 280, the software tool creates an identical interface 285 and connects it to interface 235. Similarly, at the design top level (e.g., within design 220), there is no complementary external interface. Thus, the software tool also creates an identical interface 225 and connects it to interfaces 285. Although interface 225 is connected to logic below, it remains unconnected in the other direction. Accordingly, the software tool completes the connection by connecting interface 225 to interface 215 of the logic device 210.

A similar process is followed with respect to connecting the memory sub-component 270 to the appropriate external interface 218 of logic device 210 for connecting to the memory 250 via interface 255. However, there is one less hierarchical layer of the design 220 to traverse in making such connections as compared to the process for the Ethernet MAC sub-component 230.

In the example of FIG. 2, all of the logic blocks to be connected are unconnected leaf nodes. However, certain design tools allow the user to progress upwards from the logic block and its external interface(s), creating hierarchical blocks and assigning boundary connections to them. In such a case, the hierarchical block may be considered to be a parameterizable or a static component where some or all of its external connections and behavior cannot be varied.

Figure 3:
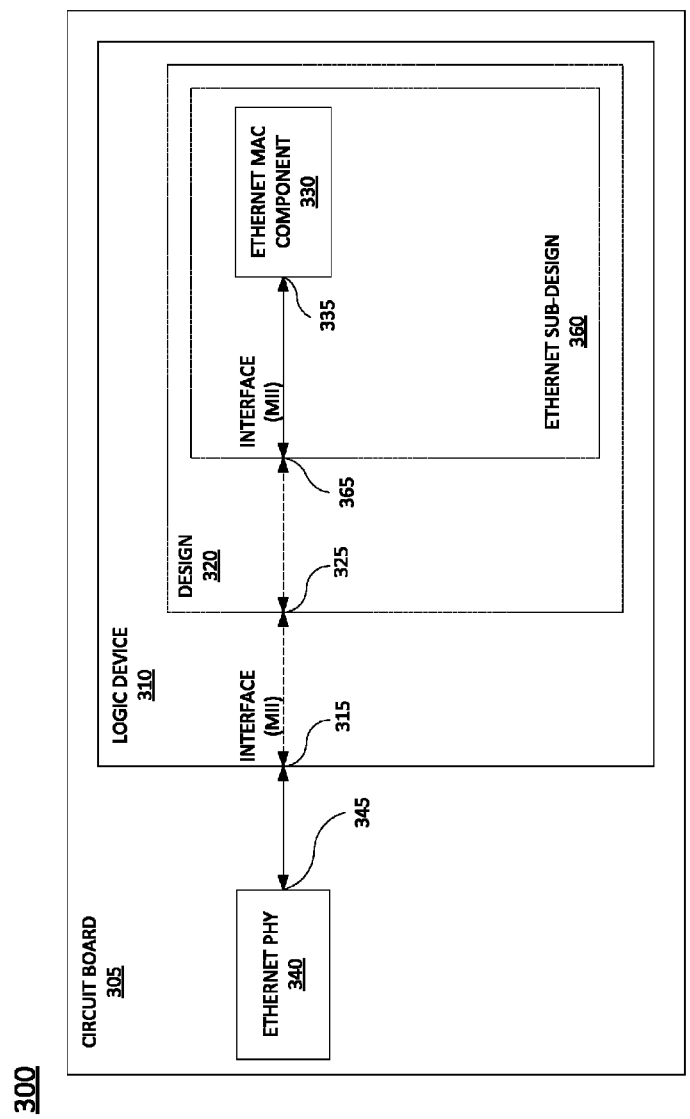
FIG. 3 illustrates a block diagram of a third device.

FIG. 3 illustrates a block diagram of a third device 300, e.g., for implementing a hierarchical design where interface connections are explicitly defined at lower levels of the design hierarchy, and some but not all interface connections are explicitly defined at higher levels of the design hierarchy. The device 300 includes a design 320 that can be implemented within logic device 310. Logic device 310 is mounted on or otherwise connected to circuit board 305 which also includes an Ethernet PHY 340. Interfaces 315 and 345 are connected according to the pre-configuration of device 300. In one example, each of these interfaces comprises a MII, i.e., they are of the same interface type. Design 320 includes a component 360 (an Ethernet subcomponent/sub-design) which includes a subcomponent, Ethernet MAC component 330. In this example, the Ethernet sub-design, component 360, is a fully formed modular design that includes an external interface 365 that is already connected to the lower-level logic block, component 330, via interface 335, but which is not connected at the top level of the design 320. Accordingly, in one instance, when traversing the design upwards from the logic block(s) towards the design top level, the software tool starts at the highest level of existing ports for nets connected to the logic block (e.g., beginning with the layer of component 360), and traverses upwards from that point in a similar process to that described above in connection with FIG. 2. The software tool does not need to add connections at the lowest logic block level of the design, as appropriate connections already exist. In this case, the software tool detects that interface 335 is not connected to another logic block, but only connected to interface 365 as an intermediate layer of design hierarchy, and is unconnected at the level of the Ethernet sub-design, component 360. The software tool also detects its interface type is a Media Independent Interface (MII). Traversing up to the top level of the design 320, there are no other interfaces detected. On the logic device, the software tool detects an unconnected interface 315, which is also of the MII type. Thus, the software tool infers that interfaces 315 and 365 should be connected, automatically creates intermediate interface 325 and connects it to both interface 315 and interface 365. For example, the software tool adds the new interface and the connections to a representation of the design 320 (e.g., by modifying or adding to the HDL code).

Figure 4:
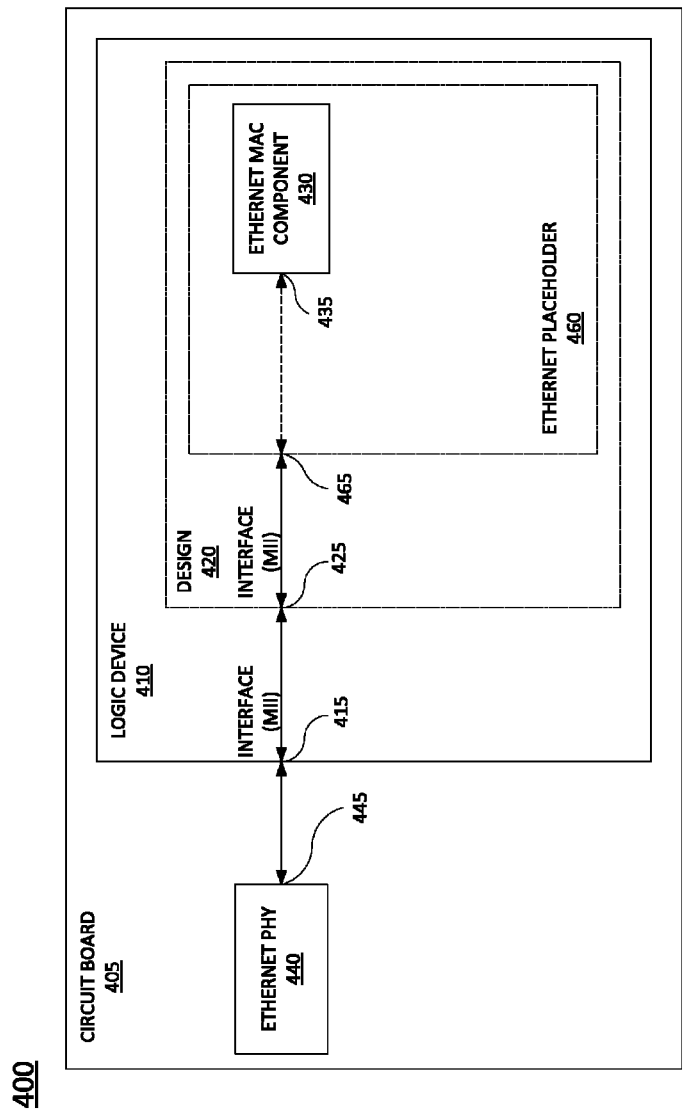
FIG. 4 illustrates a block diagram of a fourth device.

In a similar example, FIG. 4 illustrates a block diagram of a fourth device 400, e.g., for implementing a hierarchical design where interface connections are explicitly defined at higher levels of the design hierarchy, and some but not all interface connections are explicitly defined at lower levels of the design hierarchy. The device 400 includes a design 420 that can be implemented within logic device 410. Logic device 410 is mounted on or otherwise connected to circuit board 405, which also includes an Ethernet PHY 440. Design 420 includes an Ethernet sub-design, component 460, which includes a further Ethernet MAC subcomponent, component 430. The design 420 is similar to design 320 in FIG. 3. However, design 420 already includes a connection between external interface 425 of the top-level design and the external interface 415 of the logic device 410. (Interface 415 is connected to interface 425 of the Ethernet PHY 440 according to the pre-configuration of the target device, i.e., device 400). Design 420 also includes an explicit connection between the interface 425 of the top level design and interface 465 of component 460 (Ethernet placeholder). For example, a top-down design tool may allow the user to progress downwards from the board top level and its known connections, creating placeholder blocks and assigning boundary connections to them so as to partition the design. In such a case, the external connections at the design top level may already be present and connected to lower-level placeholders; but have no actual logic blocks at the "lower" end of the signal.

In one example, the software tool determines the ports associated with an identified signal, as well as the signals associated with an identified port. For instance, the software tool first carries out an initial search of the design components for unconnected interfaces. It regards an interface as "unconnected" if none of its ports are connected to a logic block, or design component at both ends, i.e. the net has one or fewer "concrete" ports on a logic device or logic block (it may be connected to abstract ports at an intermediate layer of the design hierarchy). In such case, the software tool may still traverse the design upwards from the logic block(s) towards the design top level. Similar to the above described examples, the software tool infers the connections between unconnected interfaces of a same interface type and adds such connections to the design. Thus, when traversing the design upwards from the unconnected interface on the logic block towards the design top level, the software tool searches each intervening level's existing ports for nets already connected upwards to the logic device and not connected elsewhere within the design. When the existing "upwards" connection is encountered, it is reused, and no further upwards traverse of the hierarchy is required.

In the example of FIG. 4, the software tool, starting from the logic block level, determines that component 430 has an unconnected interface 435. Traversing through higher layers of the design, the software tool will then determine that the logic device includes an unconnected interface 415 that is of the same interface type as interface 435, e.g., a MII interface type. In this case, the software tool detects that interface 415 is not connected to another logic block, but only connected to interface 465 via interface 425 as intermediate layers of design hierarchy. The software tool then infers that the interfaces 435 and 465 should be connected and adds the necessary interfaces and connections at various layers of the design hierarchy. For instance, the software tool connects the interface 435 to interface 465 in the layer above.

The previous examples of FIGS. 1-4 assume that all connections added at a layer of the design (whether the top level of the design, or an intermediate layer containing the logic block) will connect to a single logic block. However, it is possible for a developer to partition an external connection across several logic blocks, each handling a subset of the connections within the interface (e.g., a partial or split interface).

Figure 5:
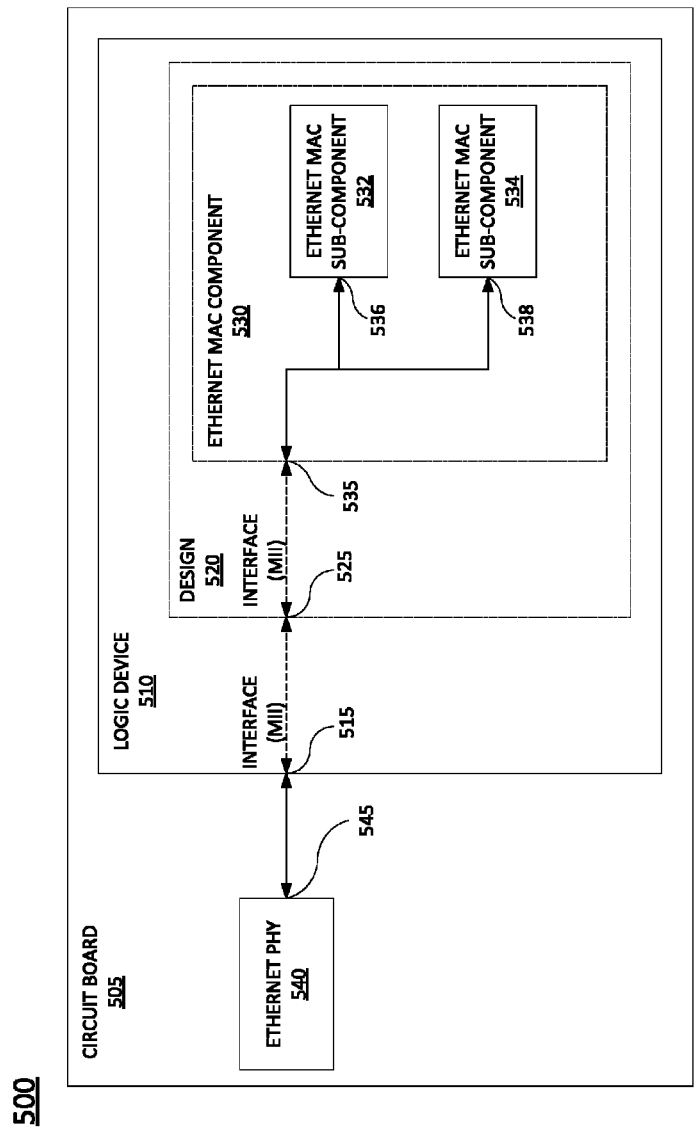
FIG. 5 illustrates a block diagram of a fifth device.

FIG. 5 illustrates a block diagram of a fifth device 500, e.g., for implementing a hierarchical design having at least one split interface. The device 500 includes a design 520 that can be implemented within logic device 510. Logic device 510 is mounted on or otherwise connected to circuit board 505 which also includes Ethernet PHY 540. Interfaces 545 and 515 are connected according to the pre-configuration of device 500. Design 520 includes component 530, an Ethernet MAC component, which has two subcomponents 532 and 534. Component 530 has an external interface 535, which is a split interface. In other words, it is connected to two different interfaces 536 and 538 of each of the two respective Ethernet MAC subcomponents 532 and 534. For example, interface 535 may comprise a complete MII interface while interfaces 536 and 538 may each comprise the transmitter and receiver signal components of the MII interface. In this example, the split interface is explicitly defined in the design. As such, when traversing upward from the lowest level of the design hierarchy the first unconnected interface that the software tool will encounter is interface 535, which comprises a full MII interface. From this point, the software tool simply operates in the same or in a substantially similar manner as described above in connection with any one or more of FIGS. 1-4. For example, the software tool traverses through higher layers of the design searching for unconnected interfaces, infers connections where there are unconnected interfaces of a same interface type at different hierarchical layers, and creates/adds any necessary intermediate interfaces and connections to the design. In this case, traversing upward from component 530, the software tool encounters no other unconnected interfaces in the design, but does detect that there is an unconnected MII interface 515 of the logic device 510. Accordingly, the software tool infers that interfaces 515 and 535 should be connected, since there are at different layers and are both of the MII interface type. The software tool then creates interface 525 at the intermediate layer (e.g., the top level of design 520), and connects the new interface to both interface 515 and interface 535.

Figure 6:
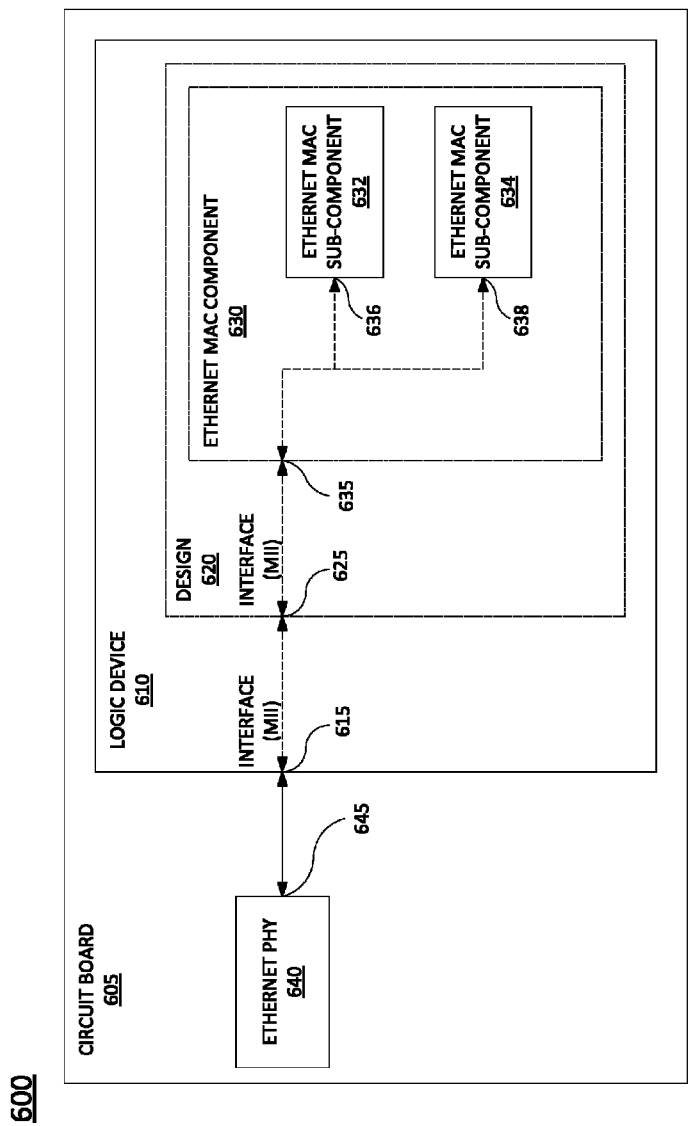
FIG. 6 illustrates a block diagram of a sixth device.

The example of FIG. 5 relates to a design where the split interface is explicitly described, e.g., in the HDL code at the RTL. However, another example also provides for inferring connections for split interfaces automatically via the software tool. FIG. 6 illustrates this scenario.

In particular, FIG. 6 illustrates a block diagram of a sixth device 600, e.g., for implementing a hierarchical design having at least one split interface. The device 600 includes a design 620 that can be implemented within logic device 610. Logic device 610 is mounted on or otherwise connected to circuit board 605 which also includes Ethernet PHY 640. Interfaces 645 and 615 are connected according to the pre-configuration of device 600. In one example, the external interface 615 of logic device 610 is defined in a constraint file of the logic device 610 and/or for the device 600. Design 620 includes an Ethernet MAC component 630, which has two Ethernet MAC subcomponents 632 and 634. Notably, the design includes a split interface on the subcomponents 632 and 634. For example, interfaces 636 and 638 may each comprise a partial MII interface. However, in contrast to the example of FIG. 5, the split interface in FIG. 6 is left for inference by the software tool.

In such a situation, the software tool compares the connected ports within the interface. Where there is an overlap with an existing connection, no further attempt is made to create connections. However, where there is no overlap (i.e., the two sets of connections are complementary within the external interface) then both are connected, and the software tool continues to traverse upwards to the logic device boundary. In the present example, the software tool traverses the design upwards from the logic block level and encounters unconnected interfaces 636 and 638. On the logic device 610, the software tool encounters unconnected interface 615. The software tool also notes that interfaces 636, 638 and 615 are of a same interface type (e.g., a MII interface type). Accordingly, when interfaces 636 and 638 are non-overlapping and complementary, both are connected to interface 615. In this case, interfaces 636 and 638 are the transmitter and receiver parts of the interface and do not overlap in the connection with interface 615 (since no connections between the interfaces 636, 638 and 615 are explicitly defined). As an example, the software tool may apply a default solution of connecting the first encountered unconnected interface (e.g., interface 636) with the pins comprising the transmitter signals of the MII interface 615, whereas the second encountered unconnected interface 638 will be connected with the receiver signals of the MII interface 615. In this example, the software tool creates/adds MII interfaces 625 and 635 within the intermediate layers of the design in order to connect the components 632 and 634 at the lowest level of the design hierarchy through to the external interface 615 of the logic device 610. In one circumstance, the software tool may additionally offer an option to the user/designer to manually override the automatic selection in cases of ambiguity, e.g., if the partial interfaces were designed so that they are implemented as interchangeable upper and lower halves of a data bus, to swap which of the interfaces 636 and 638 should be connected to the most and/or least significant parts of the data bus of the full MII interface 615 and the design top-level.

In some situations, a design component, e.g., a configurable logic block (CLB), is able to configure its external interface(s) into one of several possibilities. For instance, an Ethernet MAC CLB might offer any one of MII, GMII, RGMII, SGMII, and the like as possible interfaces. In this case, the software tool notes each unconnected interface on the logic device and searches the design for components with unconnected external interfaces that match that interface type. Where a configurable component offers several external interfaces, it selects the closest match. The software tool then defines an interface at the design top level, makes a connection between the logic device and the design top level, and a makes a connection between the design top level and the configurable component, or CLB.

Figure 7:
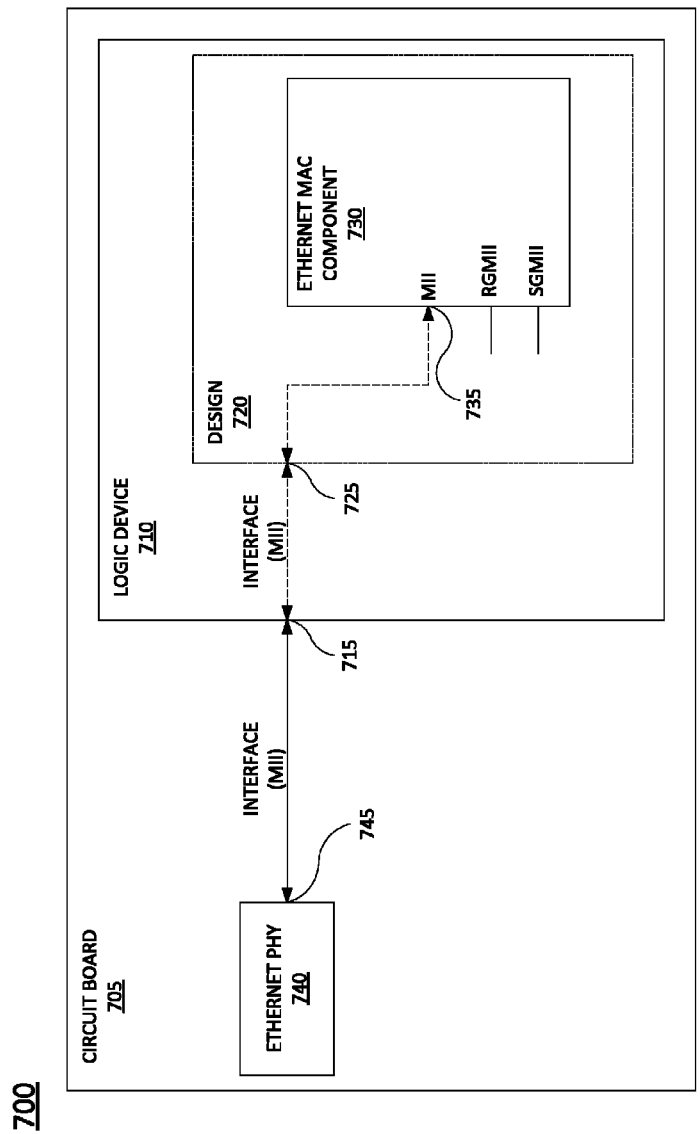
FIG. 7 illustrates a block diagram of a seventh device.

As an example, FIG. 7 illustrates a block diagram of a seventh device 700 according to another aspect of the present disclosure, e.g., for implementing a design component having two or more alternative interfaces of a same general interface type. The device 700 includes a design 720 that can be implemented within logic device 710. Logic device 710 is mounted on or otherwise connected to circuit board 705 which also includes Ethernet PHY 740. Interfaces 745 and 715 are connected according to the pre-configuration of device 700. In particular, device 700 includes a MII connection between the logic device 710 and Ethernet PHY 740. Thus, interfaces 715 and 745 are both MII interfaces. Design 720 includes an Ethernet MAC component 730 that is configurable to provide one of several versions of an interface for media access control, e.g.: a MII, a RGMII or a SGMII interface. It should be noted that component 730 is an example of a configurable component, as compared to a static or a parameterizable component. For instance, component 330 in FIG. 3 may be considered to be a static component since its external interfaces cannot be varied, and component 270 in FIG. 2 may be considered a parameterisable component since the width of its connections may be varied (e.g. to use either a 16-bit or a 32-bit data bus), whereas component 730 may be considered to be a configurable component, since its MII interface 735 can be replaced by an RGMII interface 745 or SGMII interface 755, resulting in a different interface appearing on the logic block.

In any case, when the software tool is applied to design 720, the software tool discovers three unconnected external interfaces at the level of the Ethernet MAC component 730. However, the software tool only determines a single unconnected external interface for media access control on the logic device 710 (i.e., the interface 715 of the MII interface type). Since an available unconnected MII interface was found in the design, the software tool selects the MII interface for implementation. For instance, the software tool adds an intermediate MII interface 725, to the top-level of the design, and connects the new interface to the interface 715 on the logic device 710 as well as to the MII interface 735 of the Ethernet MAC component 730. The RGMII and SGMII interfaces of the Ethernet MAC component 730 remain unused. In one instance, the metadata description of the logic block indicates that a particular group of interfaces are mutually exclusive. In addition, there may be an update script associated with the logic block that checks for connections, and configures the logic block parameters appropriately. For example, the component 730 may, via the update script, determine that its MII interface 735 has been connected and then reconfigure itself to exclusively use this interface.

Figure 8:
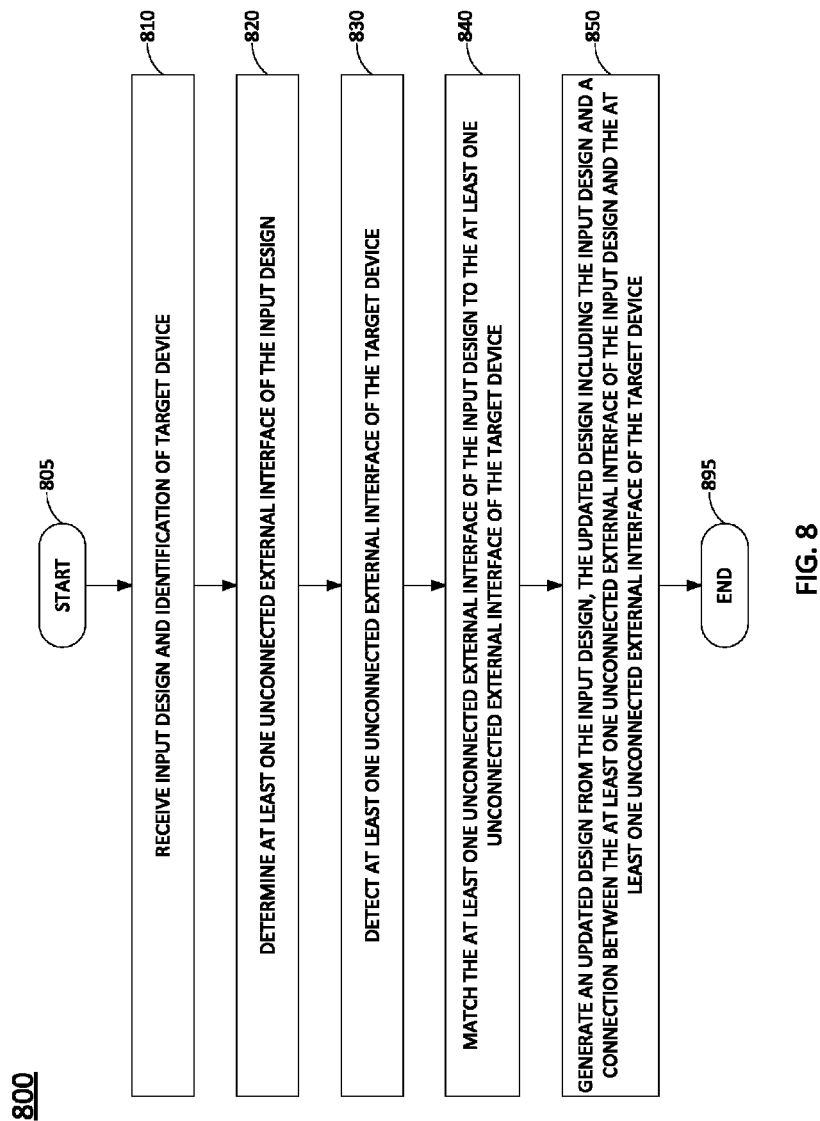
FIG. 8 illustrates a block diagram of a method for creating a platform-specific logic design from an input design.

FIG. 8 illustrates a block diagram of an exemplary method 800 for creating a platform-specific logic design from an input design according to the present disclosure. For example, any one or more of the steps, operations or functions of the method 800 may be implemented by a general purpose computer having a processor, a memory, etc. as illustrated below in FIG. 9, specifically programmed to perform the steps, functions and/or operations of the method. The method starts in step 805 and proceeds to step 810.

In step 810, the method receives an input design and an identification of a target device. For instance, the input design may comprise a HDL description, or code. In one example, the design is a description of digital logic to be implemented on one or more target devices. In one example, the identified target device is selected from among several possible target devices. For instance, a target device may be selected from among one of several possible FPGA's, ASICs, dedicated ICs, and so forth. As an example, the input design may comprise a logic design for a MAC controller for controlling a physical Ethernet chip, sometimes referred to as an Ethernet PHY. In addition, the designer may intend for the design to be used in a variety of different platforms or devices with different interfaces between various components. Thus, in one instance the design may comprise a HDL description with external interfaces for the MAC controller, but does not include any connections between the external interfaces of the MAC controller and the corresponding interfaces on any particular target device. Rather, one or more of the external interfaces of the design remain unconnected.

In one example, the method also receives a constraint file that includes at least one constraint regarding at least a portion of the digital logic. For instance, the constraint file may include a restriction on a location for implementing the digital logic within the target device, or a restriction of signal timing for signals associated with the digital logic. The design may also include at least one component that has a metadata description. For example, a component within the design may comprise a configurable logic block, or IP core that is referenced by its metadata description.

In one example, the input design may comprise a hierarchical design, e.g., having one or more layers. In one example, each of a plurality of components of the input design may comprise a leaf node. In one example, one or more of the components at a same layer may include connections with one another, along with connections to above and below layers within a design hierarchy, e.g., external interfaces. In one example, the input design may include one or more split interfaces. For example, two or more components may have interfaces that match to respective portions of a single larger interface at higher layer within the design. For instance, two components may have partial transmitter and receiver MII interfaces which connect (or which will later be connected by the method 800) to a complete MII interface on a logic device of the target device, or to a complete MII interface at a next layer above.

In step 820, the method determines at least one unconnected interface of the input design. For example, the method may parse the input design to generate a netlist of all interfaces and their connections within the input design. The method may further note which interfaces are external interfaces contained in the netlist that do not have an external connection. For example, interfaces for a connection between two components at a same level of design hierarchy are not considered to be external interfaces. However, an interface between a component and other layers of the design is considered to be an external interface. In addition, an interface at the top level of the design, e.g., for sending and receiving signals outside of the design, is also considered to be an external interface. In one embodiment, the method uses a synthesis tool/synthesizer and/or a netlister tool to generate the netlist from the input design. In another instance, the netlist is pre-generated, and is provided to, or obtained by the method at step 810.

In step 830, the method detects at least one unconnected external interface of the target device. For example, the method may be provided with or may obtain configuration and/or constraint file(s) for the target device. The method may then determine from such files the external interfaces of the target device. For instance, the configuration file for the target device may describe a Media Independent Interface (MII) on a logic device that is connected to a MII of an Ethernet PHY. In this example, the method determines from the configuration file that MII of the logic device is connected in one direction (to the Ethernet PHY), but determines from the input design that the same MII interface is not connected in the other direction to any portion of the input design. Thus, the MII interface of the logic device of the target device is considered to be unconnected.

At step 840, the method matches the at least one unconnected external interface of the input design to the at least one unconnected external interface of the target device. For example, the method may compare any unconnected external interfaces of the input design determined at step 820 with any unconnected external interfaces of the logic device/target device detected at step 830. Where there is a match between the interface types of one or more of the unconnected external interfaces of the input design and one or more of the unconnected external interfaces of the target device, the method notes that the two interfaces should be connected. For example, if the method finds an unconnected MII interface in the input design and an unconnected MII interface of the target device, the method flags the two interfaces for connection. Similarly, the input design may include a partial interface or a split interface. In such instance, the method may note that two or more partial interfaces of the design should be connected to an interface of the logic device. In one example, the method further offers to a user the option to override a default connection made for partial interfaces. For example, the method may connect the first encountered unconnected external interface of the input design with pins comprising the most significant bits of the unconnected external interface of the target device and connect the second encountered unconnected interface of the input design with pins comprising the 8 least significant bits of the unconnected external interface of the target device. However, the user/designer may have desired that the positions be reversed.

At step 850, the method generates an updated design from the input design. For example, the method generates and adds any necessary intermediate interfaces within the design hierarchy, and adds connections between the interfaces to connect the at least one unconnected external interface of the input design to the at least one unconnected external interface of the target device. In some cases, the method may also add any necessary intermediate interfaces and connections by supplementing the HDL description of the input design at the RTL to generate the updated design. For example, the method may add definitions for any new interfaces added at intermediate layers, and may add explicit connections between previously unconnected interfaces within the design and/or on the logic device.

In one example, at step 850 the method traverses the hierarchy by starting with the logic block containing the at least one unconnected external interface of the input design and moving to the next hierarchical layer towards the top level of the design. In some cases, the starting logic block may be at the lowest hierarchical layer of a design. In other cases, e.g., where the design may include static components at lower levels of the design, the method may begin at an intermediate layer. The method notes the interface type of the at least one unconnected external interface of the input design. At each layer traversed, if an interface of the same interface type does not exist, the method generates a new interface of that type and connects it to the interface below. If, when moving to a next higher layer an external interface of the same type is found, the method connects the interfaces of the current layer and the next higher layer and stops. Similarly, if the top level of the design is reached and an interface of the same type does not exist at the top level, the method creates the interface, adds it to the design, connects it to the corresponding interface at the layer below and connects it to the corresponding interface of the logic device/target device.

It should be noted that at any one or more of the steps 810-850, the method may perform any one or more of the functions and/or operations of the software tool(s) described above in connection with FIGS. 1-7. For example, at step 850 the method may create interface 465 in FIG. 4 and connect the interface to interfaces 425 and 435 in the layers above and below. Similarly, step 850 may comprise generating interfaces 625 and 635 in FIG. 6 and connecting such interfaces to each other and to the layers above and below. As still another example, step 950 may further comprises In other words, each of steps 820-850 may vary depending upon the input design as well as the identification of the target device received at step 810.

Following step 850, the method proceeds to step 895 where the method ends.

It should also be noted that although not specifically specified, one or more steps of method 800 may include a storing, displaying and/or outputting step as required for a particular application. In other words, any data, records, fields, tables, and/or intermediate results discussed in the method can be stored, displayed and/or outputted to another device as required for a particular application. Furthermore, steps, operations or blocks in FIG. 8 that recite a determining operation or involve a decision, do not necessarily require that both branches of the determining operation be practiced. In other words, one of the branches of the determining operation can be deemed as an optional step.

FIG. 9 depicts a high level block diagram of a general purpose computer, a computing device, or a computing system 900 suitable for use in performing some or all of the functions described herein. As depicted in FIG. 9, the system 900 comprises a processor element 902 (e.g., a CPU), a memory 904, e.g., a random access memory (RAM) and/or a read only memory (ROM), a module 905 for creating a platform-specific logic design from an input design, and various input/output devices 906 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

The present disclosure can be implemented in a combination of software and hardware, e.g., using application specific integrated circuits (ASIC), a PLD such as a FPGA, a general purpose computer or any other hardware equivalents such as microprocessors. In one example, the present module or process for creating a platform-specific logic design from an input design can be loaded into memory 1004 and executed by processor 902 to implement the functions as discussed above. As such, the present module or process 905 for creating a platform-specific logic design from an input design (including associated data structures) of embodiments of the present invention can be stored on a non-transitory computer readable storage medium, e.g., RAM memory, magnetic or optical drive or diskette and the like.

The present disclosure may also be implemented in whole or in part by a programmable IC, e.g., a PLD and/or FPGA. A programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, the circuits shown above in connection with FIGS. 1-7 may be implemented in a plurality of CLBs that perform equivalent logic operations of any one or more components of any one or more of the circuits of FIGS. 1-7. Thus, in one embodiment the computing device 900 may generate the necessary configuration data/instructions to configure an FPGA to perform the various functions as disclosed above. For example, in one embodiment, the computing device 900 can be configured to receive a platform-neutral input design and generate an output design for implementation within a target logic device, such as an FPGA.

While the foregoing describes various examples in accordance with one or more aspects of the present disclosure, other and further embodiment(s) in accordance with the one or more aspects of the present disclosure may be devised without departing from the scope thereof, which is determined by the claim(s) that follow and equivalents thereof. Claim(s) listing steps do not imply any order of the steps. Trademarks are the property of their respective owners.

What is claimed is:

1. A method, comprising:
   receiving an input design and an identification of a target device;
   determining, by a processor, an unconnected external interface of the input design, wherein the determining comprises:
      generating a netlist from the input design; and
      identifying the unconnected external interface from one or more external interfaces of the input design within the netlist;
   detecting, by the processor, an unconnected external interface of the target device; and
   generating, automatically by the processor, an updated design from the input design when the unconnected external interface of the input design and the unconnected external interface of the target device are of a same interface type, wherein the updated design comprises the input design and further comprises a connection between the unconnected external interface of the input design and the unconnected external interface of the target device.

2. The method of claim 1, wherein the same interface type comprises a media access control interface.

3. The method of claim 2, wherein the input design comprises a media access control component and the target device comprises a physical ethernet component.

4. The method of claim 1, wherein the one or more external interfaces of the input design comprise hardware description language ports.

5. The method of claim 1, wherein the generating comprises selecting an interface version of the interface type for connecting the unconnected external interface of the input design to the unconnected external interface of the target device.

6. The method of claim 5, wherein the interface version of the interface type comprises a media access control interface.

7. The method of claim 6, wherein the interface version comprises:
   a media independent interface;
   a gigabit media independent interface;
   a reduced gigabit media independent interface; or
   a serial gigabit media independent interface.

8. The method of claim 1, wherein the unconnected external interface of the input design comprises a split interface.

9. The method of claim 8, wherein the connection comprises a connection between the split interface and the unconnected external interface of the target device.

10. The method of claim 1, wherein the unconnected external interface of the target device is detected using a constraint file for the target device.

11. The method of claim 1, wherein the input design comprises a description of digital logic to be implemented on a device.

12. The method of claim 11, wherein the input design comprises a constraint associated with a portion of the digital logic, wherein the constraint comprises:
   a restriction on a location for implementing the digital logic within the target device; or
   a restriction on a signal timing for a signal of the digital logic when the digital logic is implemented within the target device.

13. The method of claim 11, wherein the input design includes a component having a metadata description.

14. The method of claim 13, wherein the component comprises one of:
   a static component;
   a parameterizable component; or
   a configurable component.

15. The method of claim 1, wherein the unconnected external interface of the target device comprises an unconnected external interface of a logic device of the target device.

16. A non-transitory computer-readable medium storing instructions which, when executed by a processor, cause the processor to perform operations, the operations comprising:
   receiving an input design and an identification of a target device;
   determining an unconnected external interface of the input design, wherein the determining comprises:
      generating a netlist from the input design; and
      identifying the unconnected external interface from one or more external interfaces of the input design within the netlist;
   detecting an unconnected external interface of the target device; and
   generating automatically an updated design from the input design when the unconnected external interface of the input design and the unconnected external interface of the target device are of a same interface type, wherein the updated design comprises the input design and further comprises a connection between the unconnected external interface of the input design and the unconnected external interface of the target device.

17. A device comprising:
   a processor; and a computer-readable medium storing instructions which, when executed by the processor, cause the processor to perform operations, the operations comprising:

receiving an input design and an identification of a target device;

determining an unconnected external interface of the input design, wherein the determining comprises:
generating a netlist from the input design; and
identifying the unconnected external interface from one or more external interfaces of the input design within the netlist;

detecting an unconnected external interface of the target device; and generating automatically an updated design from the input design when the unconnected external interface of the input design and the unconnected external interface of the target device are of a same interface type, wherein the updated design comprises the input design and further comprises a connection between the unconnected external interface of the input design and the unconnected external interface of the target device.

* * * * *